(12) United States Patent
Chiang (10) Patent No.: US 12,125,875 B2
(45) Date of Patent: Oct. 22, 2024

(54) SEMICONDUCTOR STRUCTURE AND MANUFACTURING METHOD THEREOF

(71) Applicant: NANYA TECHNOLOGY CORPORATION, New Taipei (TW)

(72) Inventor: Chia Che Chiang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 218 days.

(21) Appl. No.: 17/663,213

(22) Filed: May 13, 2022

(65) Prior Publication Data
US 2023/0369390 A1  Nov. 16, 2023

(51) Int. Cl.
*H01L 21/00* (2006.01)
*H01L 49/02* (2006.01)
*H10B 12/00* (2023.01)

(52) U.S. Cl.
CPC .......... *H01L 28/92* (2013.01); *H10B 12/033* (2023.02); *H10B 12/31* (2023.02)

(58) Field of Classification Search
CPC ........ H01L 28/92; H10B 12/033; H10B 12/31
See application file for complete search history.

(56) References Cited

U.S. PATENT DOCUMENTS

| 2006/0281246 A1* | 12/2006 | Tegen | H01L 21/31111 |
| | | | 257/E21.252 |
| 2008/0044971 A1* | 2/2008 | Kang | H01L 28/91 |
| | | | 438/657 |
| 2022/0344450 A1* | 10/2022 | Lee | H01L 28/86 |

FOREIGN PATENT DOCUMENTS

TW          718859 B      2/2021

* cited by examiner

*Primary Examiner* — Richard A Booth
(74) *Attorney, Agent, or Firm* — CKC & Partners Co., LLC (57) ABSTRACT

A manufacturing method of a semiconductor structure includes forming a dielectric layer stack including a first oxide layer and a second oxide layer over the first oxide layer. An opening is formed in the dielectric layer stack, and includes a first portion exposing sidewalls of the first oxide layer and a second portion exposing sidewalls of the second oxide layer. A sacrificial layer is formed over the dielectric layer stack and along the sidewalls of the first oxide layer and the second oxide layer in the opening. A first etching is performed to remove the sacrificial layer along the sidewalls of the first oxide layer. A second etching is performed to widen the first portion of the opening. The sacrificial layer along the sidewalls of the second oxide layer and over the dielectric layer stack is removed. A capacitor is formed in the opening after removing the sacrificial layer.

15 Claims, 14 Drawing Sheets

SEMICONDUCTOR STRUCTURE AND MANUFACTURING METHOD THEREOF

BACKGROUND

Field of Disclosure

The present disclosure relates to a semiconductor structure and a manufacturing method thereof.

Description of Related Art

A memory structure includes several capacitors and transistors arranged in an array. A word line connected with transistors is able to turn on or turn off the transistors. If the transistors ore on, the transistor may connect with the capacitor to charge or discharge the capacitor, and data may be written or read by a bitline connected to the transistors.

SUMMARY

A manufacturing method of a semiconductor structure includes forming a dielectric layer stack, in which the dielectric layer stack includes a first oxide layer and a second oxide layer over the first oxide layer. An opening is formed in the dielectric layer stack, and the opening includes a first portion exposing sidewalls of the first oxide layer and a second portion exposing sidewalls of the second oxide layer. A sacrificial layer is formed over a top surface of the dielectric layer stack and along the sidewalls of the first oxide layer and sidewalls of the second oxide layer in the opening. A first etching process is performed to remove a first portion of the sacrificial layer along the sidewalls of the first oxide layer. A second etching process is performed to widen the first portion of the opening. A second portion of the sacrificial layer along the sidewalls of the second oxide layer and over the top surface of the dielectric layer stack is removed. A capacitor is formed in the opening of the dielectric layer stack after removing the second portion of the sacrificial layer.

According to some embodiments, forming a dielectric layer stack comprises sequentially forming a first nitride layer, the first oxide layer, a second nitride layer, the second oxide layer and a third nitride layer from bottom to top.

According to some embodiments, the first oxide layer is doped with a dopant, and the dopant comprises boron, phosphorus, or combinations thereof.

According to some embodiments, the manufacturing method further includes adjusting a concentration of the dopant during forming the dielectric layer stack, such that the concentration of the dopant in the first oxide layer becomes lower as being farther away from a bottom surface of the dielectric layer stack.

According to some embodiments, the sacrificial layer along the sidewalls of the second oxide layer is thicker than the sacrificial layer along the sidewalls of the first oxide layer during forming the sacrificial layer According to some embodiments, the first etching process further laterally and partially removes the sacrificial layer along the sidewalls of the second oxide layer.

According to some embodiments, the manufacturing method further includes controlling duration of the first etching process to remove the sacrificial layer along the sidewalls of the first oxide layer.

According to some embodiments, a first etchant used in the first etching process etches the sacrificial layer faster than etches the first oxide layer.

According to some embodiments, a second etchant used in the second etching process etches the first oxide layer faster than etches the sacrificial layer.

A manufacturing method of a semiconductor structure includes forming a dielectric layer stack, in which the dielectric layer stack includes a first nitride layer, a first oxide layer, a second nitride layer, a second oxide layer and a third nitride layer from bottom to top. An opening is formed in the dielectric layer stack, and the opening comprises a first portion exposing sidewalls of the first oxide layer and a second portion exposing sidewalls of the second oxide layer, and a width of the second portion of the opening has a width being greater than a width of the first portion of the opening. The first portion of the opening is widened, such that the sidewalls of the first oxide layer are substantially perpendicular to the bottom surface of the dielectric layer stack. A capacitor is formed in the opening of the dielectric layer stack after widening the first portion of the opening.

According to some embodiments, forming the capacitor in the opening of the dielectric layer stack includes forming a bottom electrode layer along sidewalls of the opening, removing a portion of the third nitride layer and a bottom electrode layer to form a first hole exposing a corner of the second oxide layer, removing the second oxide layer from the first hole, forming a second hole in the second nitride layer to expose a portion of the first oxide layer, removing the first oxide layer from the second hole, forming a high-k dielectric layer along a sidewall of the bottom electrode layer, and forming a top electrode layer along a sidewall of the high-k dielectric layer.

According to some embodiments, the manufacturing method further includes forming semiconductor layers between the first nitride layer and the second nitride layer, and between the second nitride layer and the third nitride layer.

According to some embodiments, the manufacturing method further includes forming a semiconductor layer in contact with the top electrode layer.

According to some embodiments, a slope of a sidewall of the bottom electrode layer between the first nitride layer and the second nitride layer is different from a slope of a sidewall of the bottom electrode layer between the second nitride layer and the third nitride According to some embodiments, the high-k dielectric layer is between the first nitride layer and the second nitride layer.

A semiconductor structure includes a plurality of dielectric layers and a capacitor. The dielectric layers are arranged from bottom to top and layers are spaced apart from each other. The capacitor is in contact with sidewalls of the dielectric layers, wherein a middle layer of the dielectric layers defines an upper portion and a bottom portion of the capacitor, and a sidewall of the upper portion of the capacitor is more inclined than a sidewall of the bottom portion of the capacitor relative to one of the dielectric layer.

According to some embodiments, the sidewall of the bottom portion of the capacitor is substantially perpendicular to one of the dielectric layer.

According to some embodiments, a plurality of semiconductor layers are vertically between the dielectric layers.

According to some embodiments, the capacitor is in contact with bottom surfaces of the dielectric layers.

According to some embodiments, the capacitor is in contact with top surfaces of the dielectric layers.

Some embodiments of the present disclosure are related to a manufacturing process of capacitors in a memory. An additional process is used to widen the bottom of the opening which is used to accommodate the capacitor. Therefore, the bottom of the capacitor becomes wider, and the structure of the capacitor in some embodiments of the present disclosure is more stable.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure are related to a manufacturing process of capacitors in a memory device. An additional process is used to widen the bottom of the opening which is used to accommodate the capacitor. Therefore, the bottom of the capacitor becomes wider, and the structure of the capacitor in some embodiments of the present disclosure is more stable.

Figure 1:
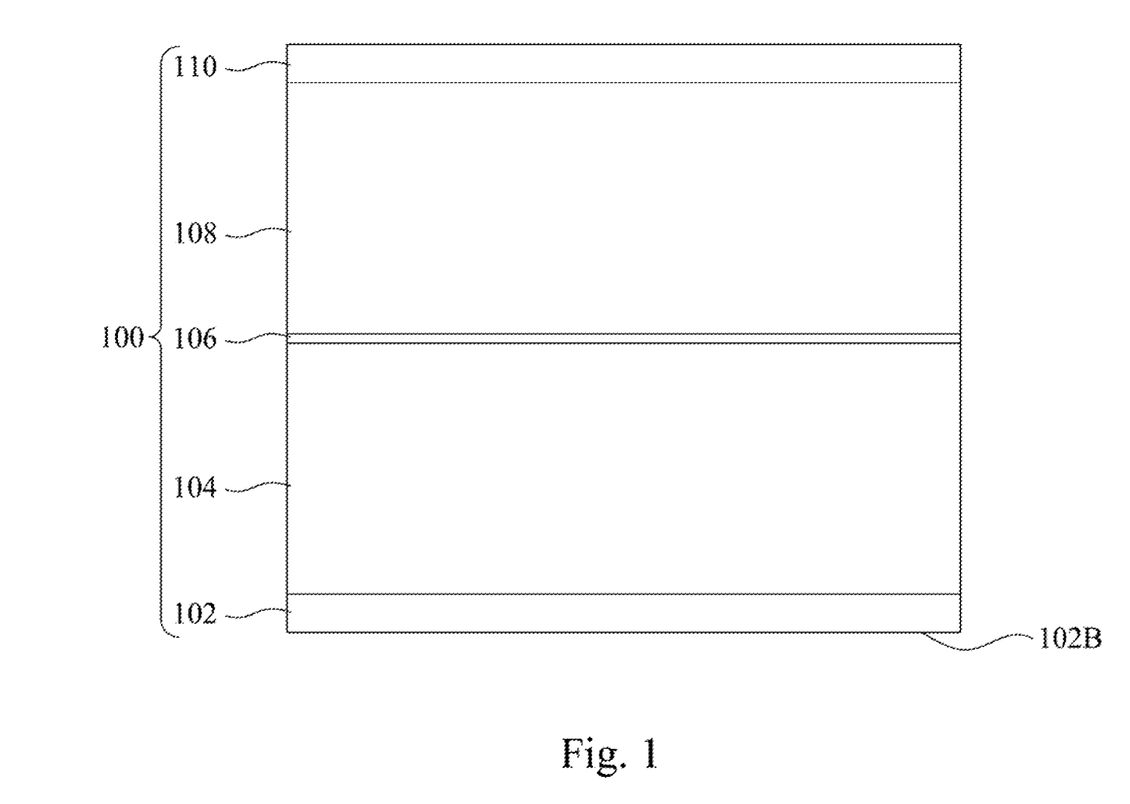
FIGS. 1-14 illustrate cross-section views of intermediate stages of a process of a semiconductor device according to some embodiments of the present disclosure.

FIGS. 1-14 illustrate cross-section views of intermediate stages of a process of a semiconductor device according to some embodiments of the present disclosure. Referring to FIG. 1, a dielectric layer stack 100 including a first oxide layer 104 and a second oxide layer 108 over the first oxide layer 104 is formed. More particularly, forming a dielectric layer stack 100 includes sequentially forming a first nitride layer 102, the first oxide layer 104, a second nitride layer 106, the second oxide layer 108 and a third nitride layer 110 from bottom to top. As a result, the first nitride layer 102 is under the first oxide layer 104, the second nitride layer 106 is between the first oxide layer 104 and the second oxide layer 108, and the third nitride layer 110 is on the second oxide layer 108. The dielectric layer stack 100 may be formed on the layer including contacts, transistors or other similar components. Therefore, the capacitors subsequently formed in the dielectric layer stack 100 are connected to other components underneath, such as transistors. In some embodiments, the first nitride layer 102, the second nitride layer 106 and the third nitride layer 110 include silicon nitride, and the first oxide layer 104 and the second oxide layer 108 include silicon oxide. In some embodiments, the thickness of the first nitride layer 102, the second nitride layer 106 and the third nitride layer 110 are less than the thickness of the first oxide layer 104 and the second oxide layer 108.

When forming the first oxide layer 104, dopants are doped in the first oxide layer 104, and the dopants include boron, phosphorus, or combinations thereof. The dopants may weaken the bonding of the silicon oxide of the first oxide layer 104, and the first oxide layer 104 may be more easily to be etched during the subsequent etching process. For example, the concentration of the dopants in the first oxide layer 104 becomes lower as being farther away from a bottom surface 102B of the dielectric layer stack 100. At higher concentration of the dopants, the bonding of the silicon oxide is more weakened, so the first oxide layer 104 at higher concentration of the dopants is more easily etched than that at lower concentration of the dopants. The concentration of the dopants may be adjusted during forming the first oxide layer 104 of the dielectric layer stack 100. In some embodiments, the formation of the first oxide layer 104 is formed by performing a chemical vapor deposition (CVD) where silicon-containing chemical (such as tetraethyl orthosilicate (TEOS)), boron-containing chemical (such as triethylborane (TEB), diborane) and phosphorous-containing chemical (such as trimethyl phosphate (TMPO) are used, and the first oxide layer 104 is formed of boro-phospho-silicate-glass (BPSG) which is silicon oxide doped with boron and phosphorous. The concentration of the dopants may be adjusted by adjusting the flow rate of the silicon-containing chemical, the boron-containing chemical and the silicon-containing chemical. On the other hands, the second oxide layer 108 is formed is dopant-free, or the dopant concentration of the second oxide layer 108 is lower than the dopant concentration of the first oxide layer 104.

Figure 2:
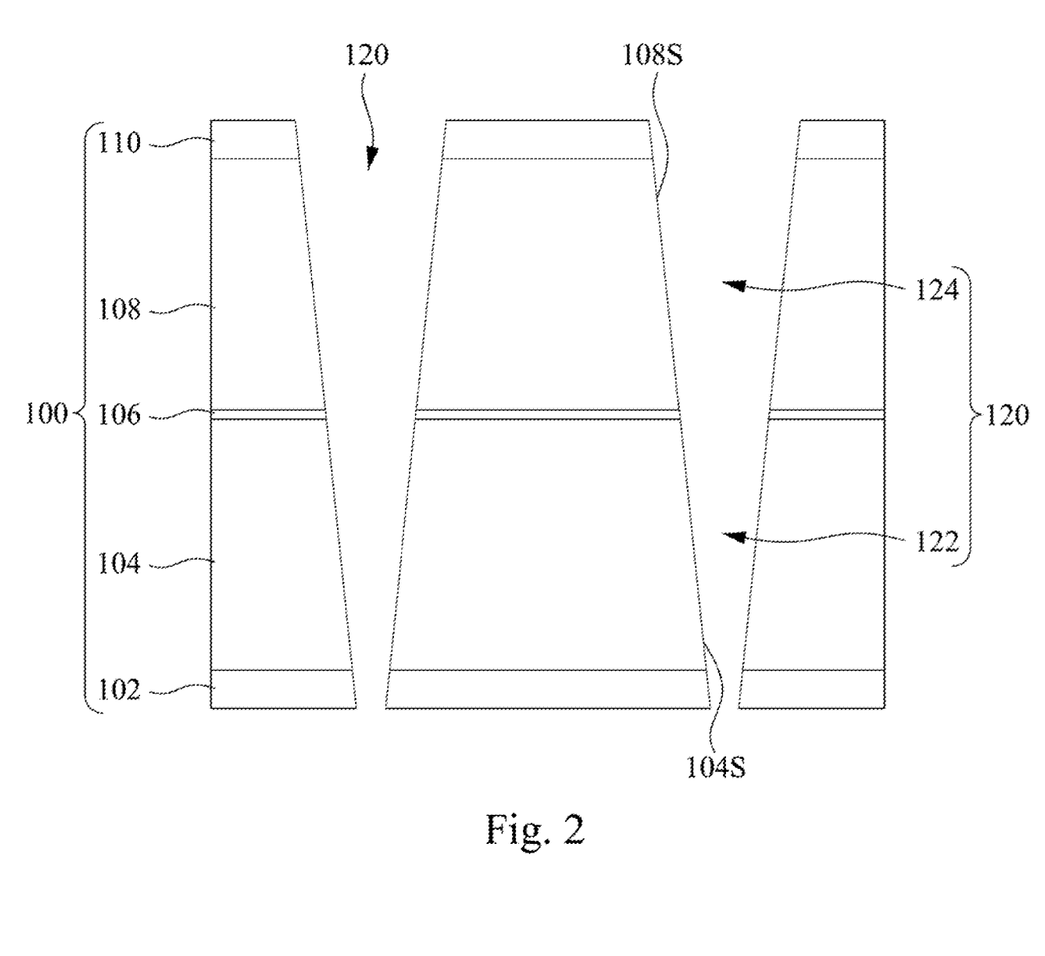

Referring to FIG. 2, after forming the dielectric layer stack 100, openings 120 are formed in the dielectric layer stack 100. Each of the openings 120 includes a first portion 122 exposing sidewalls 104S of the first oxide layer 104 and a second portion 124 exposing sidewalls 108S of the second oxide layer 108. The openings 120 are formed by any suitable methods, such as dry etching, wet etching or the like. The openings 120 are tapered in the cross-section view. That is, a width of the second portion 124 of the opening 120 has a width greater than a width of the first portion 122 of the opening 120 in a cross-section view.

Figure 3:
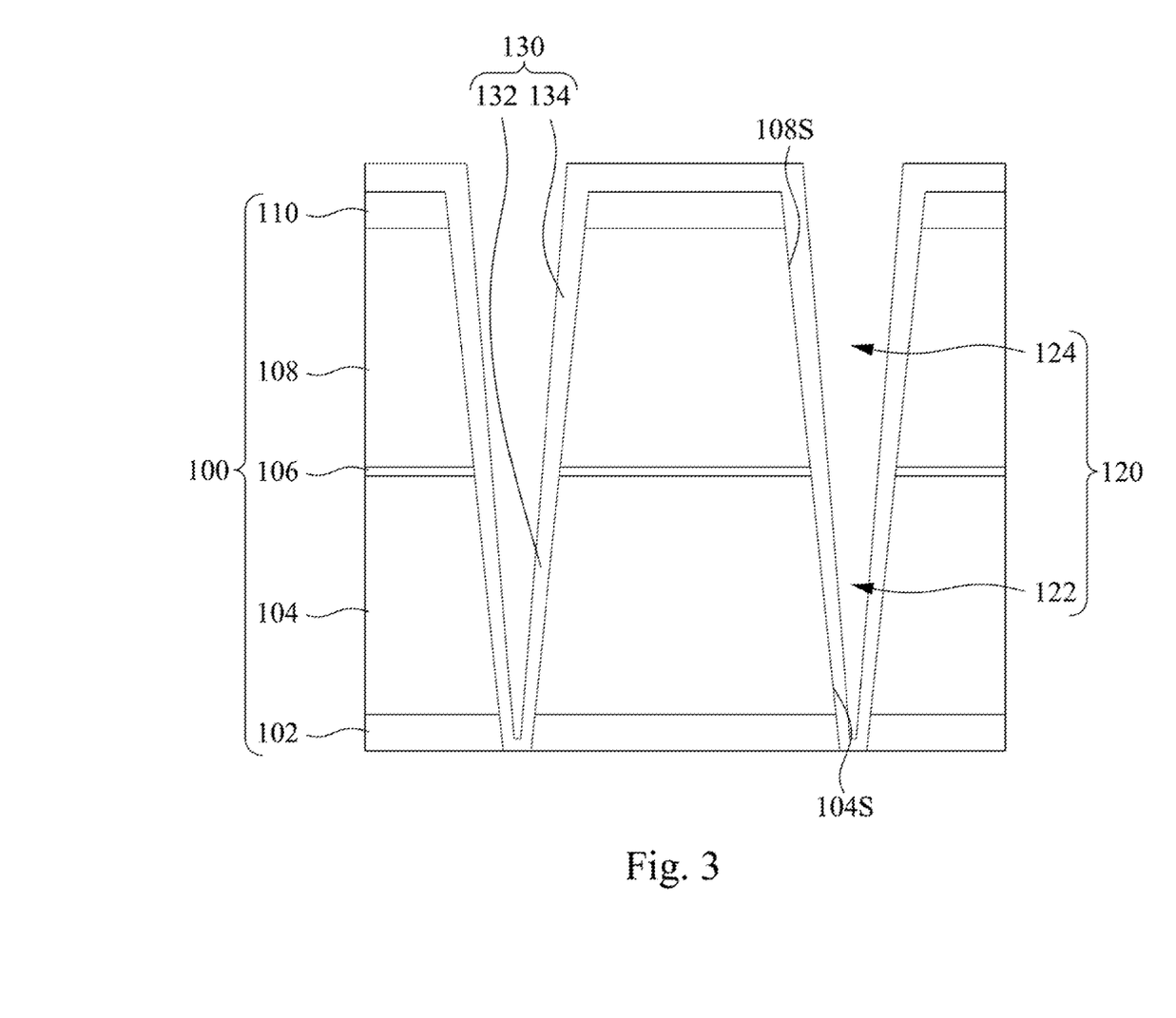
Figure 4:
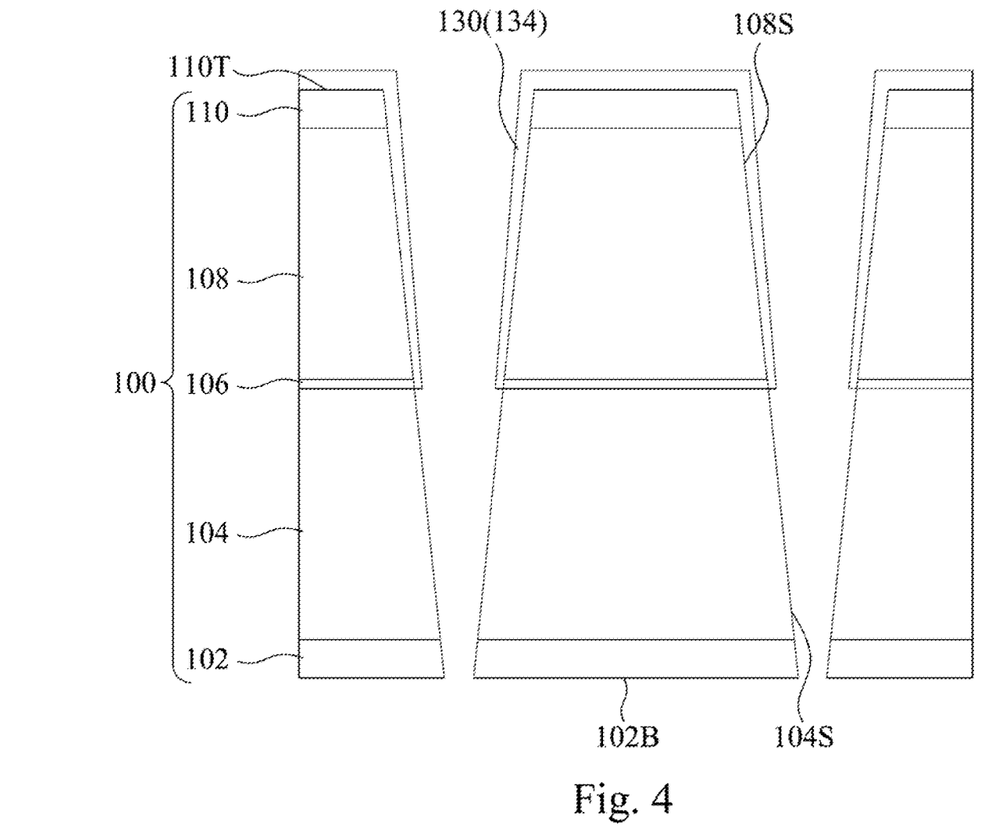

Referring to FIG. 3, a sacrificial layer 130 is formed over the top surface 110T (as shown in FIG. 4) of the dielectric layer stack 100 and along the sidewalls of the first oxide layer 104 and sidewalls of the second oxide layer 108 in the openings 120. The sacrificial layer 130 includes a first portion 132 along the sidewalls 104S of the first oxide layer 104 and a second portion 134 along the sidewalls 108S of the second oxide layer 108. The second portion 134 of the sacrificial layer 130 along the sidewalls 108S of the second oxide layer 108 is thicker than the first portion 132 of the sacrificial layer 130 along the sidewalls of the first oxide layer 104 during forming the sacrificial layer 130. Stated another way, the thickness of the sacrificial layer 130 becomes greater as being farther away from the bottom surface 102B of the dielectric layer stack 100. The smaller thickness of the first portion 132 of the sacrificial layer 130 may result from the reason that it is not so easy for the material of the sacrificial layer 130 to deposit in the first portion 122 of the opening 120 due to the narrower gap of the first portion 122. In some embodiments, the thickness of the second portion 134 of the sacrificial layer 130 is about 1 nm to about 2 nm thicker than the first portion 132 of the sacrificial layer 130. The sacrificial layer 130 may be made of material different from the dielectric layer stack 100, such as TiN. In some embodiments, the sacrificial layer 130 is also formed over the layer (such as a contact layer) underlying the dielectric layer stack 100.

Referring to FIG. 4, a first etching process is performed to remove the first portion 132 of the sacrificial layer 130 along the sidewalls 104S of the first oxide layer 104. A first etchant used in the first etching process etches the sacrificial layer 130 faster than etches the first oxide layer 104 or substantially does not etch the first oxide layer 104. In some embodiments, the first etchant may be sulfuric acid ($H_2SO_4$)

and hydrogen peroxide (H₂O₂) mixture (SPM). During the first etching process, the duration of the first etching process is controlled to remove the first portion 132 of the sacrificial layer 130 along the sidewalls 104S of the first oxide layer 104. The first etching process also laterally and partially removes the second portion 134 of the sacrificial layer 130 along the sidewalls 108S of the second oxide layer 108. Since the thickness of the second portion 134 of the sacrificial layer 130 is greater than that of the first portion 132 of the sacrificial layer 130, the second portion 134 of the sacrificial layer 130 is not entirely removed when the sidewalls 104S are exposed. Therefore, only the sidewalls 104S of the first oxide layer 104 are exposed after the first etching process. The sidewalls of the first nitride layer 102 and a portion of the layer (such as a contact layer) underlying the dielectric layer stack 100 are also exposed after the first etching process.

Figure 5:
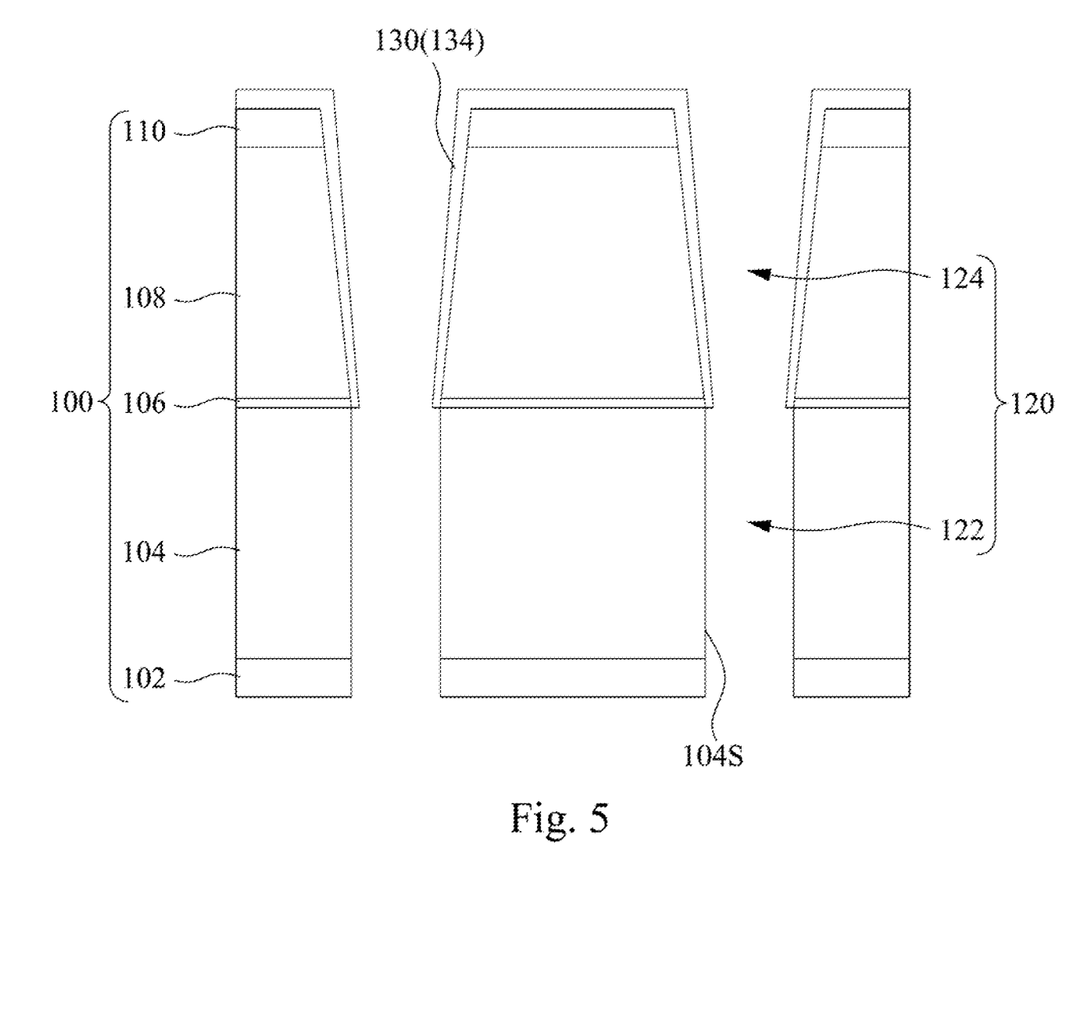

Referring to FIG. 5, a second etching process is performed to widen the first portions 122 of the openings 120. A second etchant used in the second etching process etches the first oxide layer 104 faster than etches the sacrificial layer 130 or substantially does not etch the sacrificial layer 130. In some embodiments, the second etchant may be dilute hydrofluoric acid (DHF). Since the sacrificial layer 130 is not etched or barely etched during the second etching process, the second portion 134 of the sacrificial layer 130 may serve as an etch mask during the second etching process. After the second etching process, the sidewalls 104S of the first oxide layer 104 exposed in the first portions 122 of the openings 120 become substantially perpendicular to the bottom surface 102B (as shown in FIG. 4) of the dielectric layer stack 100, while the second portions 124 of the openings 120 are still tapered. Stated another way, the sidewalls of the second oxide layer 108 are more inclined than the sidewalls 104S of the first oxide layer 104 exposed in the first portions 122 of the openings 120 relative to a bottom surface 102B (as shown in FIG. 4) of the dielectric layer stack 100. After widening the first portion 122 of the opening 120, it is easier for the material of the capacitors to be filled in the first portions 122 of the openings 120 in subsequent processes since the first portions 122 of the openings 120 are widened. The structure of the capacitors (capacitors 100 in FIG. 14) forming in the openings 120 are more stable because the capacitors in the widened first portions 122 of the openings 120 may provide sufficient support.

Figure 6:
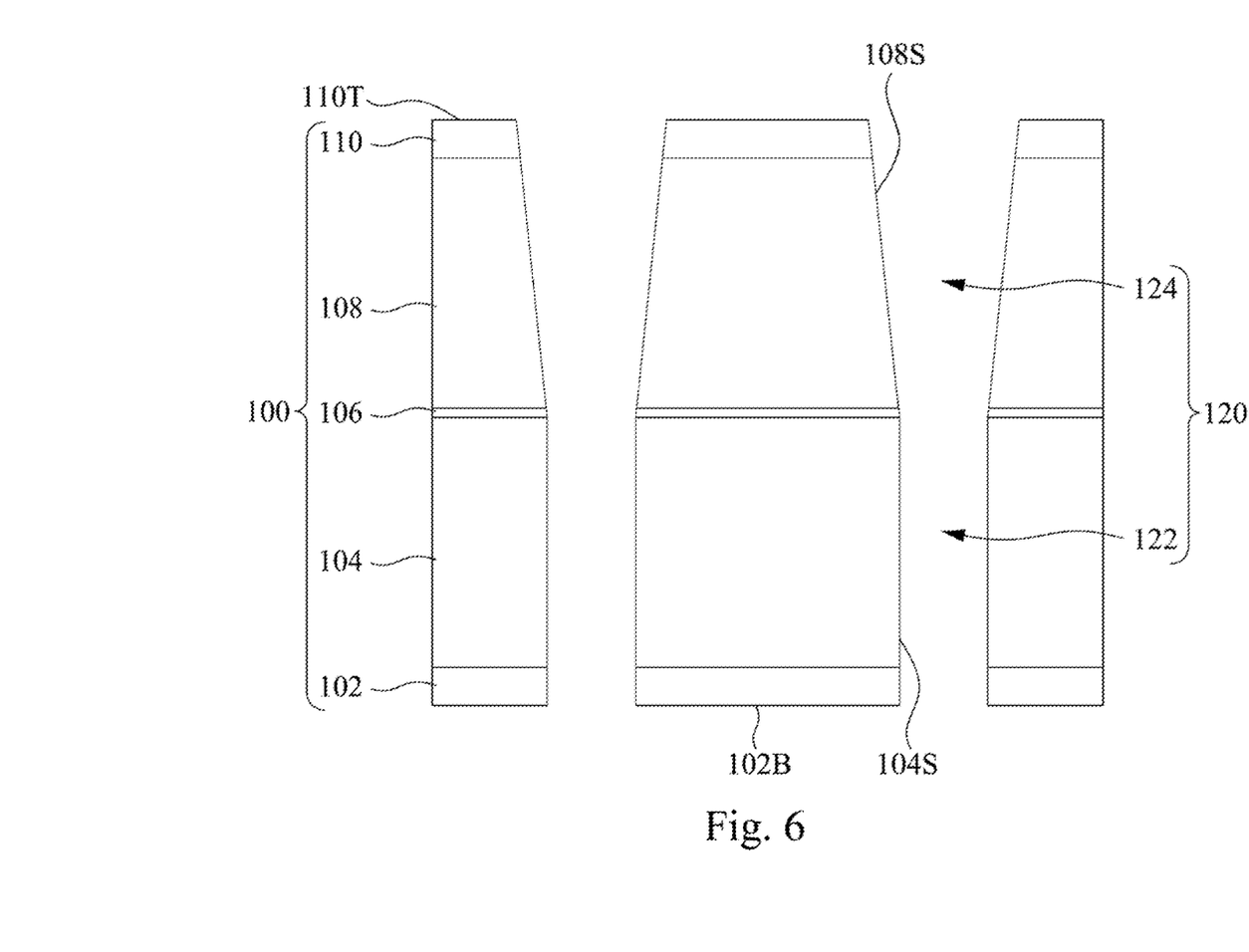
Figure 7:
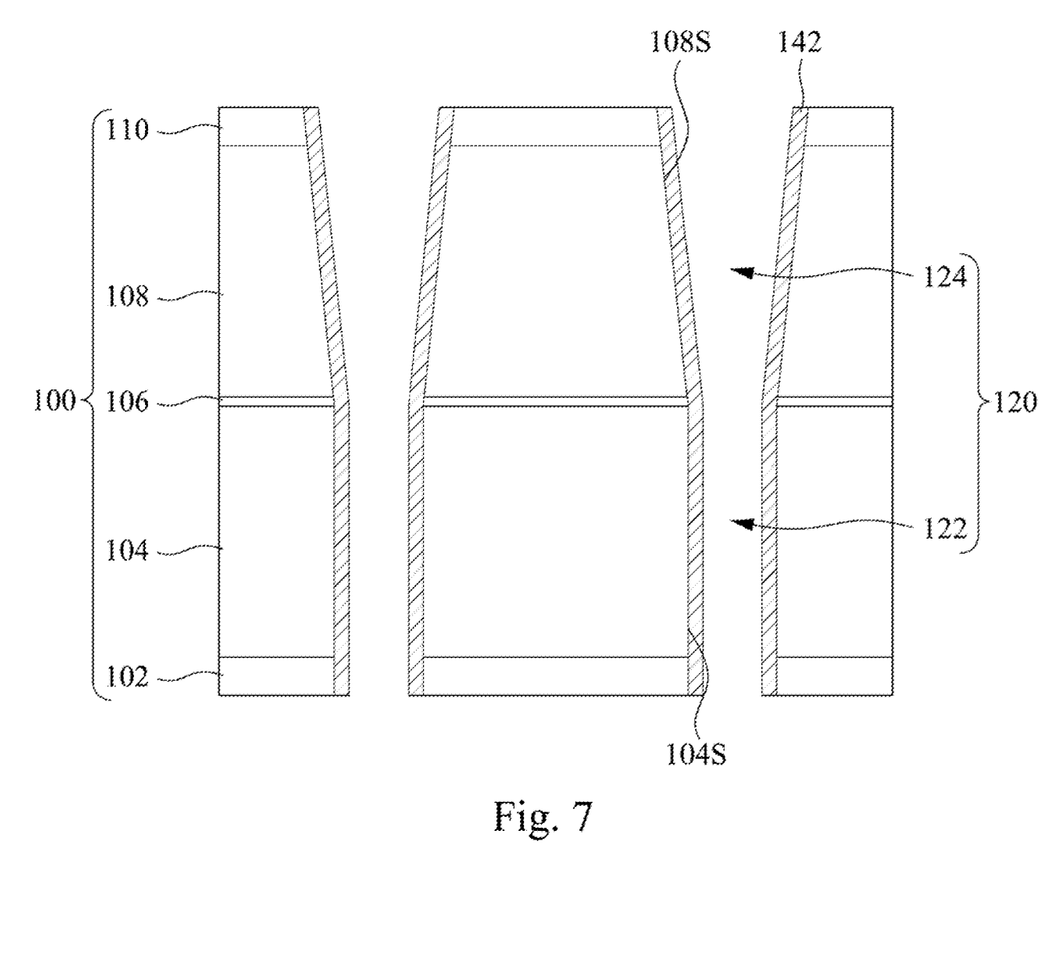

Referring to FIG. 6, the second portion 134 of the sacrificial layer 130 along the sidewalls 108S of the second oxide layer 108 and over the top surface 110T of the dielectric layer stack 100 is removed. The etchant of removing the second portion 134 of the sacrificial layer 130 is the same as or similar to the etchant removing the first portion 132 of the sacrificial layer 130. After removing the second portion 134 of the sacrificial layer 130, the sidewalls 108S of the second oxide layer 108 are more inclined than the sidewalls 104S of the first oxide layer 104 relative to a bottom surface 102B of the dielectric layer stack 100.

Referring to FIGS. 7-14, capacitors 140 are formed after removing the second portion 134 of the sacrificial layer 130. Discussed in greater details, referring to FIG. 7, bottom electrode layers 142 are formed along the sidewalls of the openings 120. A slope of a sidewall of the bottom electrode layer 142 between the first nitride layer 102 and the second nitride layer 106 is different from a slope of a sidewall of the bottom electrode layer 142 between the second nitride layer 106 and the third nitride layer 110. The bottom electrode layers 142 along the sidewalls 108S of the second oxide layer 108 are more inclined than the bottom electrode layers 142 along the sidewalls 104S of the first oxide layer 104 relative to a bottom surface 102B of the dielectric layer stack 100. In some embodiments, the bottom electrode layers 142 do not cover the top surface of the dielectric layer stack 100 and the layer (such as a contact layer) underlying the dielectric layer stack 100. In some embodiments, the bottom electrode layers 142 are formed of any suitable material, such as TiN.

Figure 8:
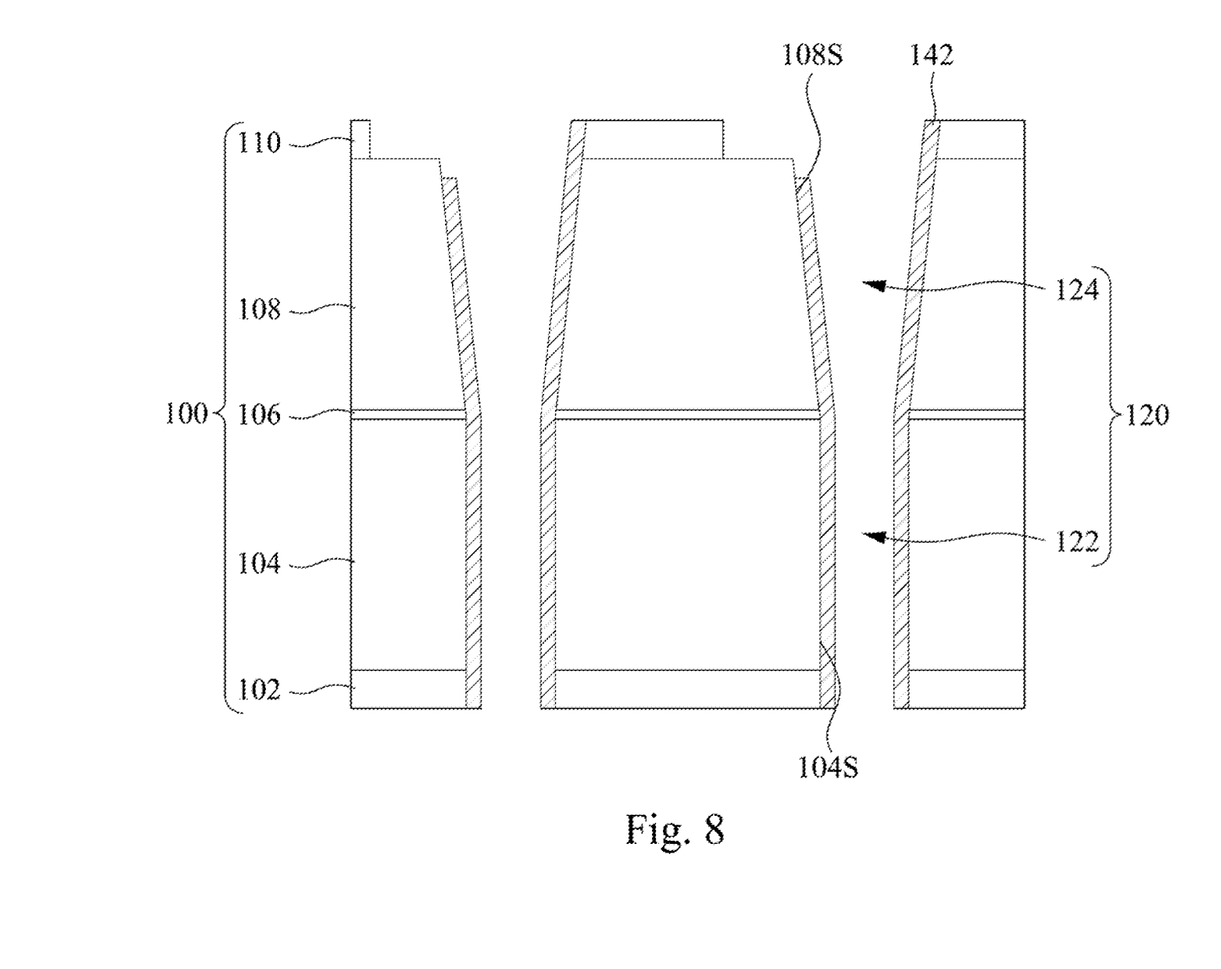
Figure 9:
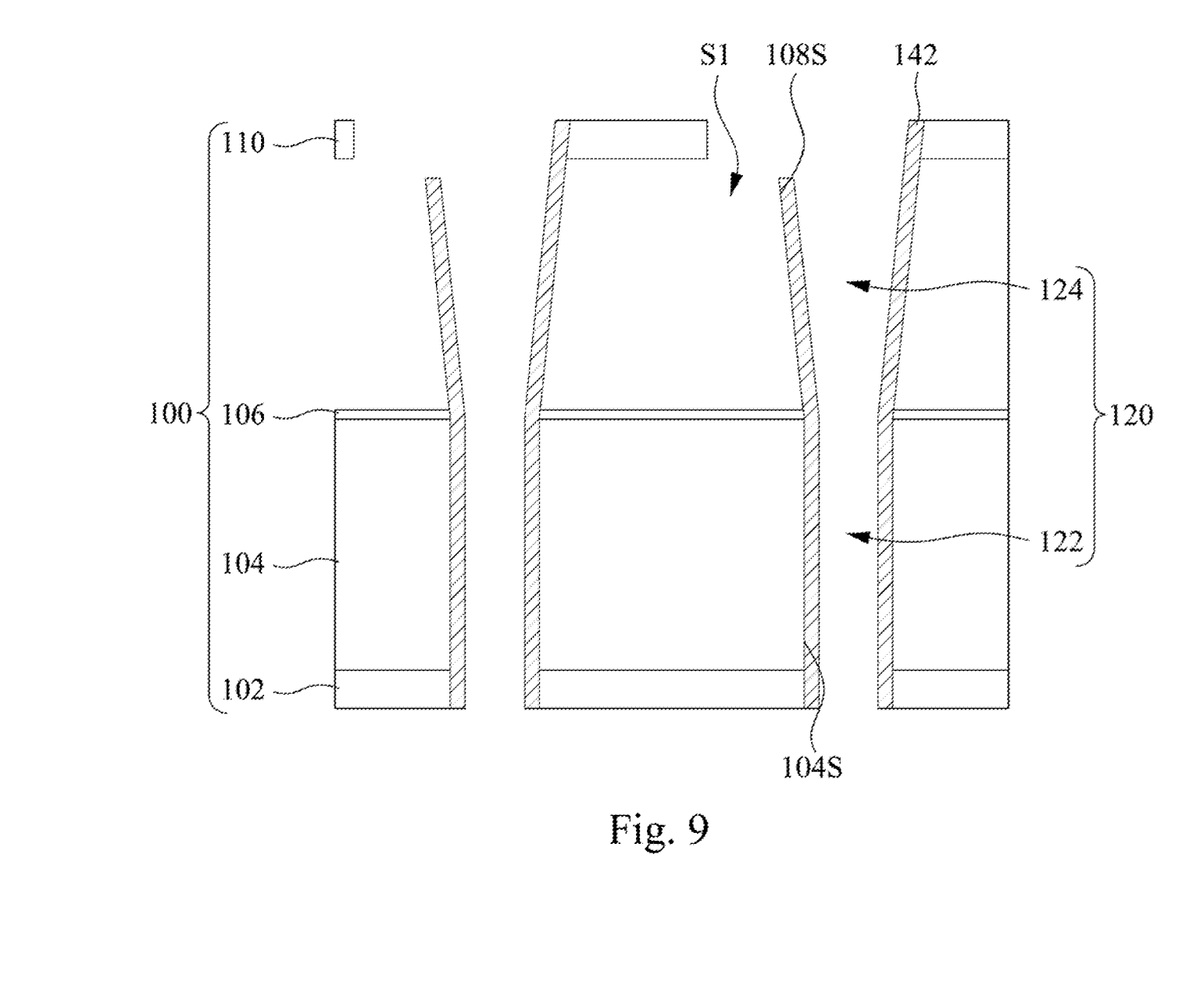

Referring to FIG. 8, a portion of the third nitride layer 110 and the bottom electrode layers 142 are removed. Discussed in greater details, a portion of the third nitride layer 110 and the top of the bottom electrode layers 142 are removed to form a first hole exposing a corner of the second oxide layer 108. Referring to FIG. 9, the second oxide layer 108 is removed. For example, an etching process may be performed from the first hole formed in FIG. 8 to remove the second oxide layer 108. After removing the second oxide layer 108, spaces S1 are formed between the second nitride layer 106 and the third nitride layer 110.

Figure 10:
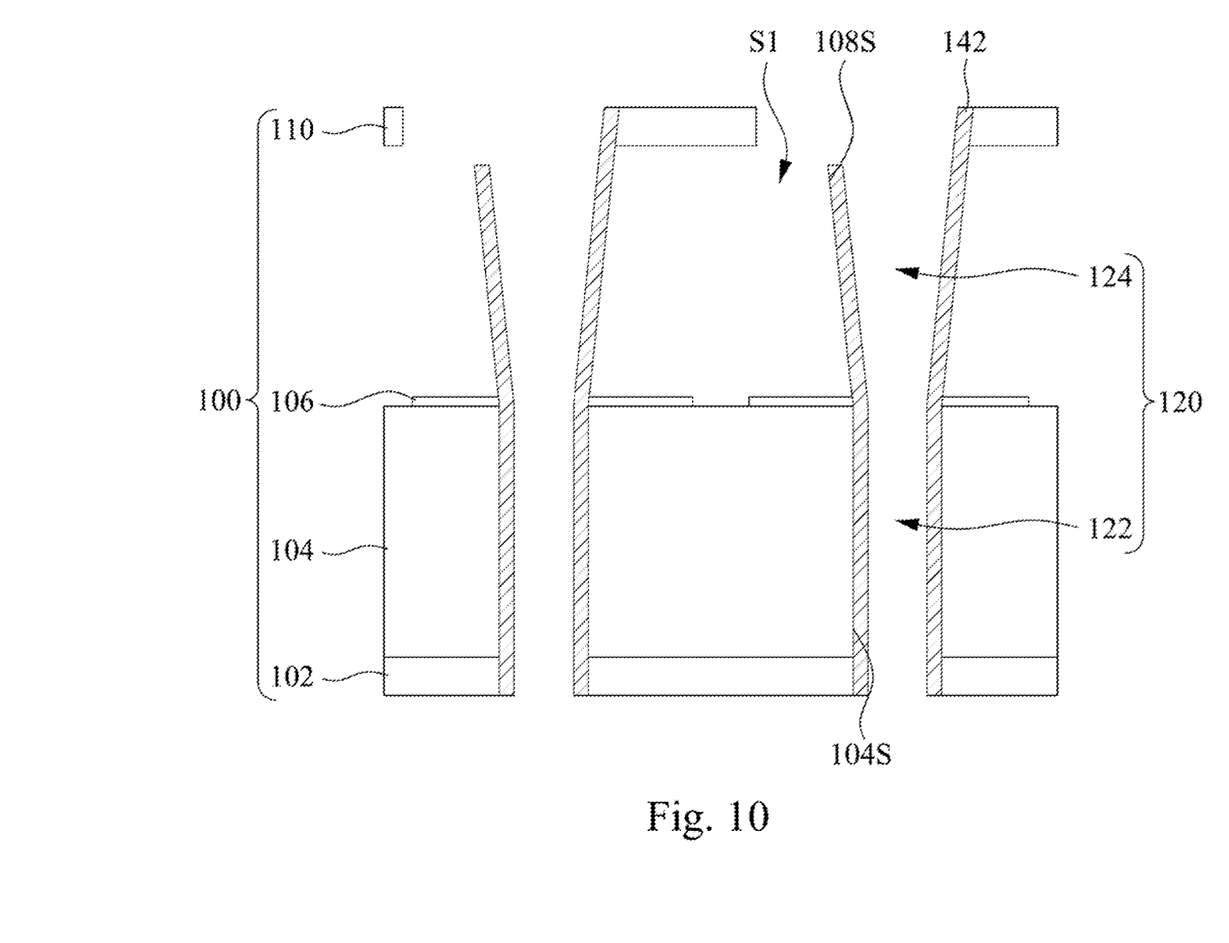
Figure 11:
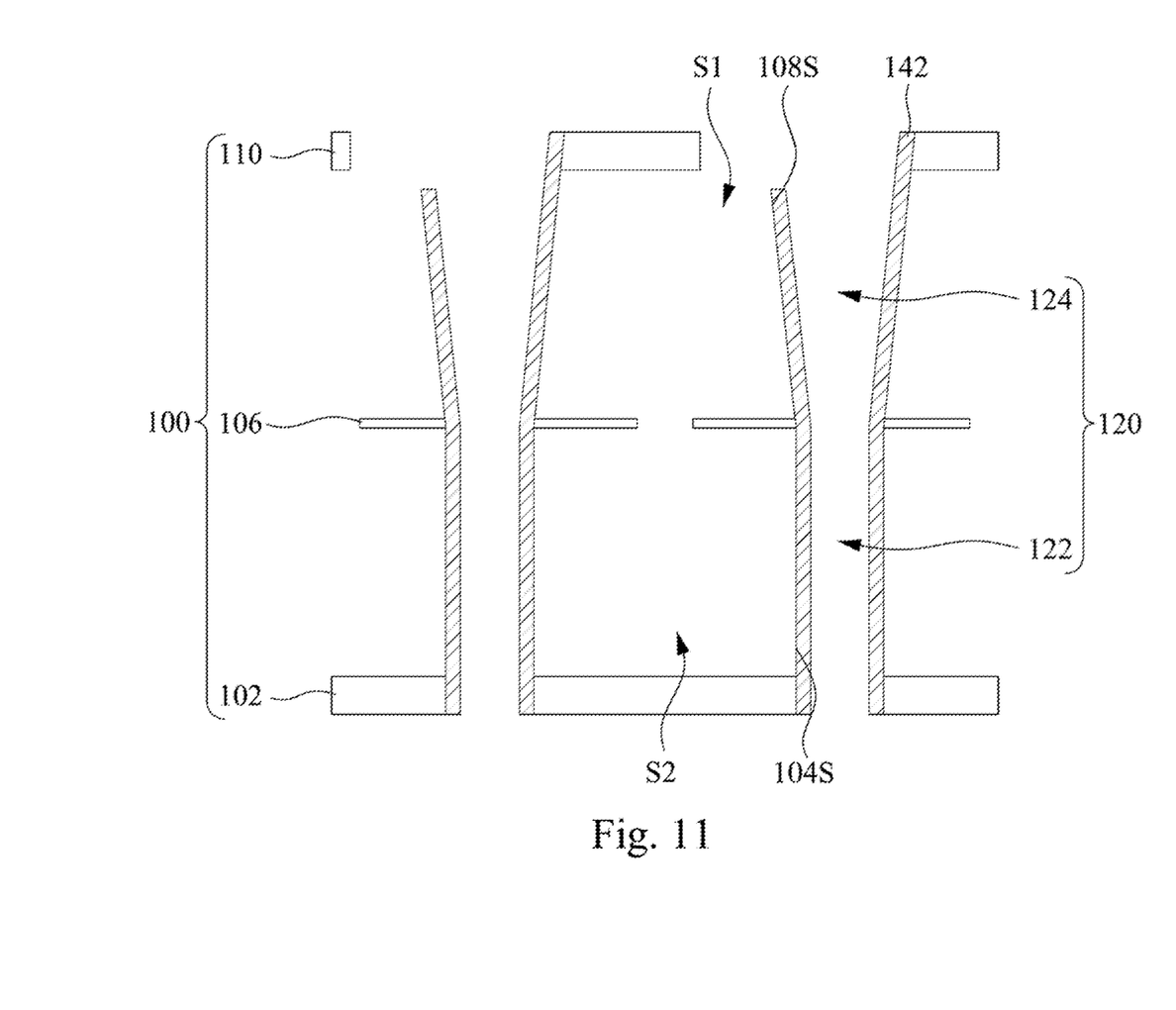

Referring to FIG. 10, a hole is formed in the second nitride layer 106 to expose a portion of the first oxide layer 104. Referring to FIG. 11, the first oxide layer 104 is removed. For example, an etching process may be performed from the hole formed in FIG. 10 to remove the first oxide layer 104. After removing the first oxide layer 104, spaces S2 are formed between the second nitride layer 106 and the first nitride layer 102, and the spaces S1 and S2 are connected by the opening in the second nitride layer 106. The first nitride layer 102, the second nitride layer 106 and the third nitride layer 110 are connected by the bottom electrode layer 142.

Figure 12:
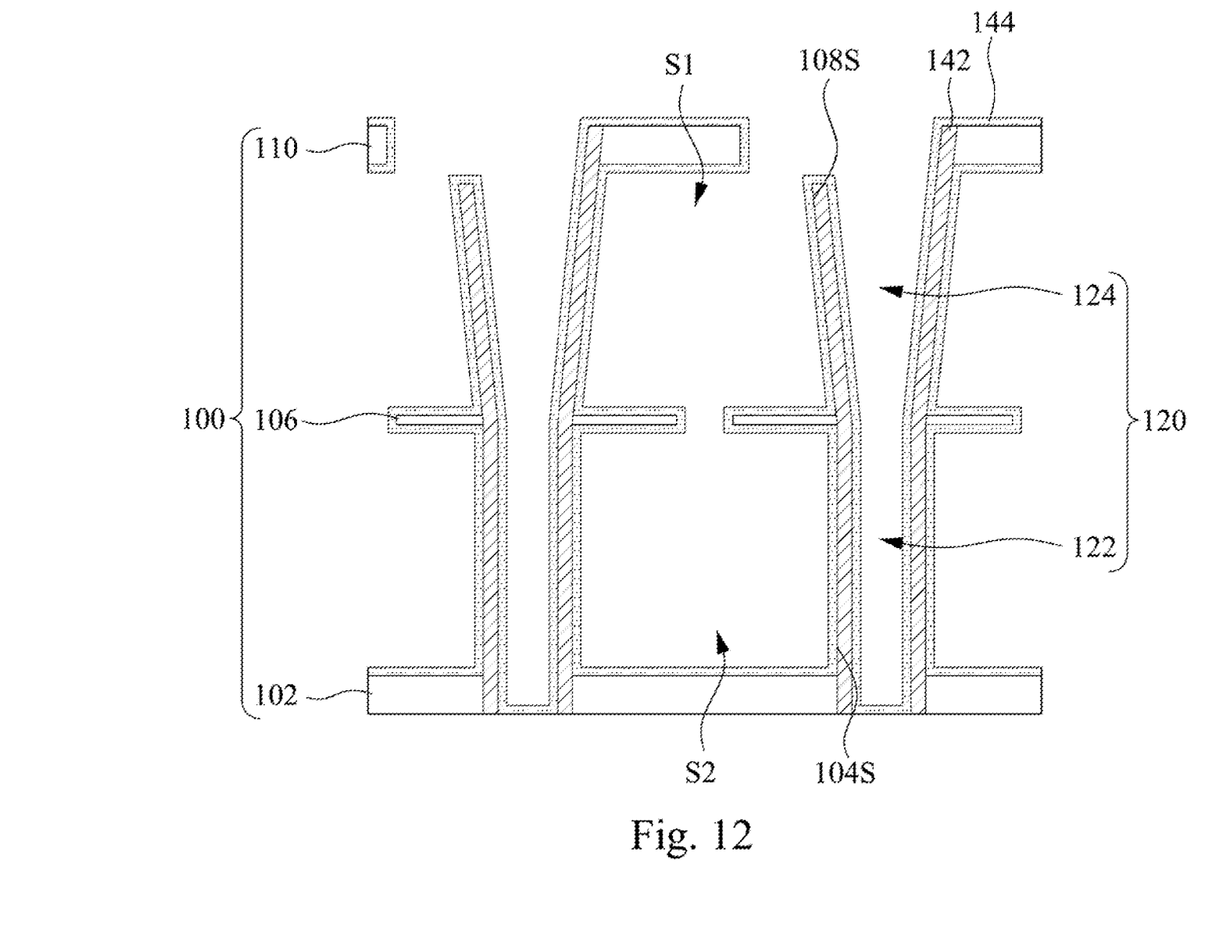

Referring to FIG. 12, high-k dielectric layers 144 are formed along sidewalls of the bottom electrode layers 142. The high-k dielectric layers 144 may be formed along the sidewalls of the bottom electrode layers 142 in the spaces S1 and S2. The high-k dielectric layers 144 may also be formed along the sidewalls of the bottom electrode layers 142 in the openings 120. Moreover, the high-k dielectric layers 144 may be formed along the sidewalls, the top surfaces and the bottom surfaces of the second nitride layer 106 and the third nitride layer 110, and the top surface of the first nitride layer 102.

Figure 13:
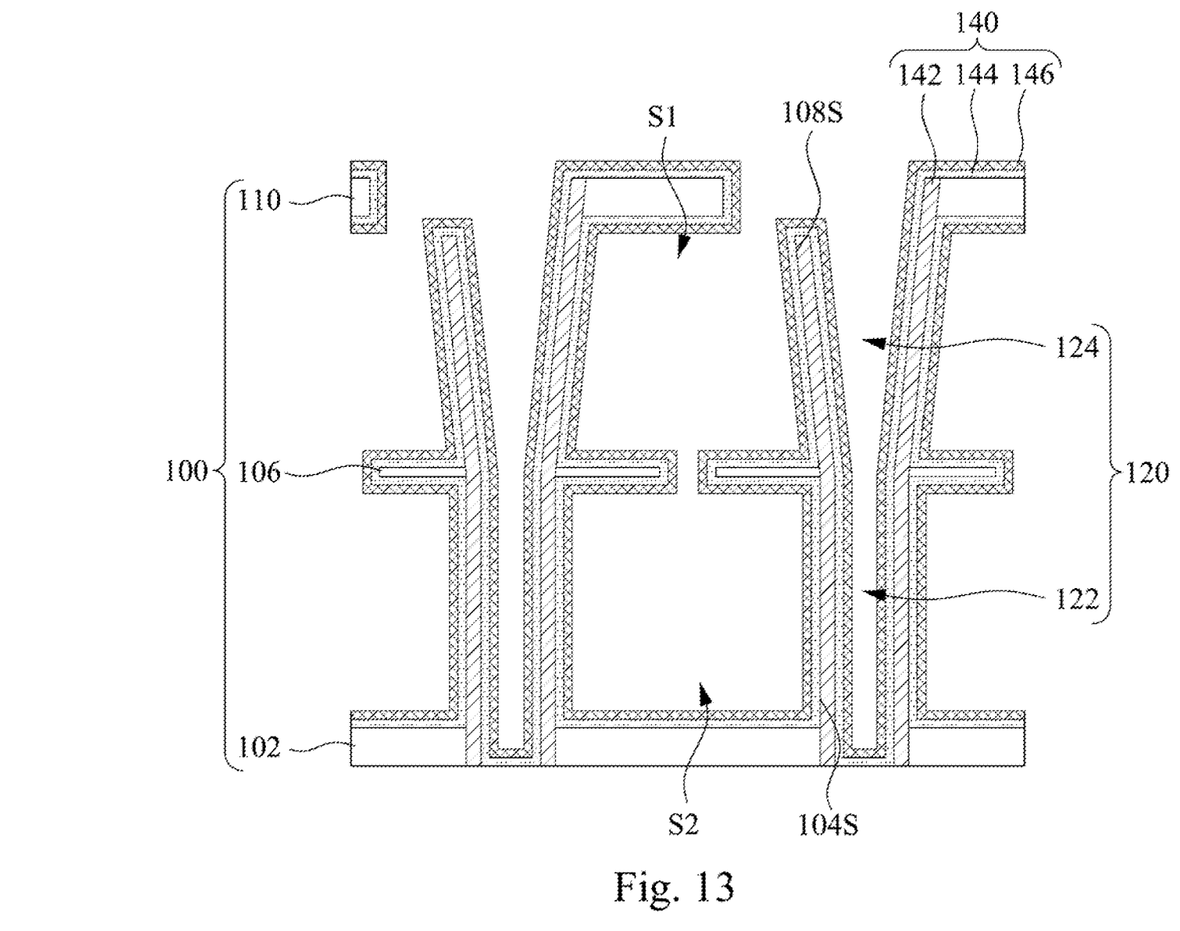

Referring to FIG. 13, top electrode layers 146 are formed along the high-k dielectric layers 144. The top electrode layers 146 may be formed along the sidewalls of the high-k dielectric layers 144 in the spaces S1 and S2. The top electrode layers 146 may also be formed along the sidewalls of the high-k dielectric layers 144 in the openings 120. In some embodiments, the top electrode layers 146 are over the horizontal surface of the high-k dielectric layers 144. The top electrode layers 146 may be formed of any suitable material, such as TiN.

Figure 14:
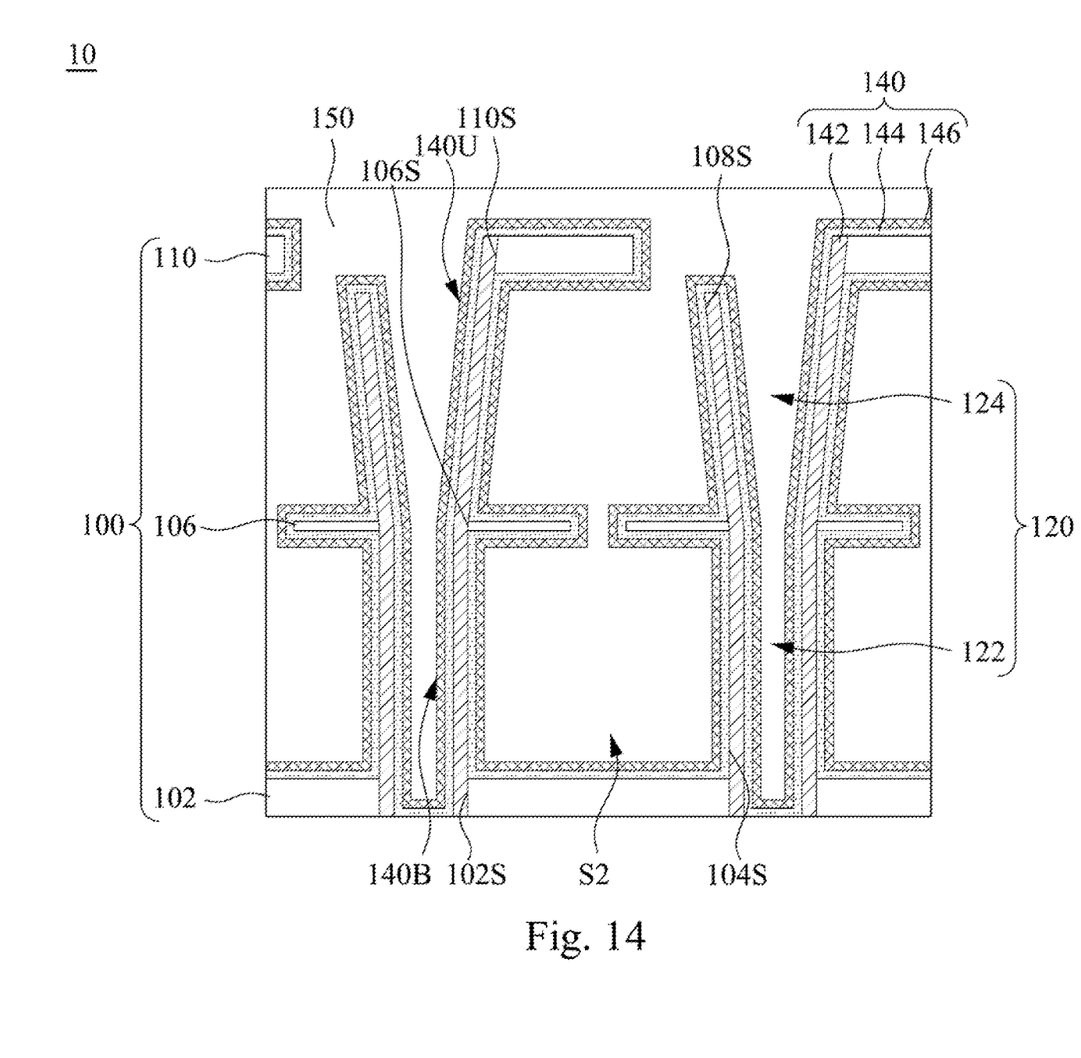

Referring to FIG. 14, semiconductor layers 150 are formed in the spaces S1 between the first nitride layer 102 and the second nitride layer 106, the spaces S2 between the second nitride layer 106 and the third nitride layer 110 and the opening in the second nitride layer 106. The semiconductor layers 150 may entirely fill the spaces S1, S2 and the openings 120. The semiconductor layers 150 may also be in contact and cover the top electrode layers 146 over the third nitride layer 110. As such, the capacitors 140 are formed in the openings 120 and in the spaces S1 and S2. Since the first portions 122 of the openings 120 are widened, the bottom electrode layer 142, the high-k dielectric layer 144, the top electrode layer 146 and the semiconductor layers 150 are formed in the openings 120 more easily. The structures of the capacitors 140 may also be stable due to strong support provided by the materials in the first portions 122 of the openings 120.

A semiconductor structure including a plurality of dielectric layers and the capacitors 140 is shown in FIG. 14. The dielectric layers include the first nitride layer 102, the second nitride layer 106 and the third nitride layer 110 arranged from bottom to top, and the first nitride layer 102, the second nitride layer 106 and the third nitride layer 110 are spaced apart from each other. Stated another way, the third nitride layer 110 is above the second nitride layer 106, and the second nitride layer 106 is above the first nitride layer 102. The width of the third nitride layer 110 is less than the first nitride layer 102.

The capacitor 140 includes the bottom electrode layer 142, the high-k dielectric layer 144 and the top electrode layer 146. The bottom electrode layer 142 of the capacitor 140 is in contact with a sidewall 102S of the first nitride layer 102, a sidewall 106S of the second nitride layer 106 and a sidewall 110S of the third nitride layer 110. The high-k dielectric layer 144 is in contact with the bottom electrode layer 142, and the top electrode layer 146 is in contact with the high-k dielectric layer 144, such that the high-k dielectric layer 144 are between the bottom electrode layer 142 and the top electrode layer 146. A middle layer of the dielectric layers (such as the second nitride layer 106 in FIG. 14) defines an upper portion 140U and a bottom portion 140B of the capacitor 140, and a sidewall of the upper portion 140U of the capacitor 140 is more inclined than a sidewall of the bottom portion 140B of the capacitor 140 relative to the dielectric layer (such as the first nitride layer 102). In some embodiments, the sidewall of the bottom portion 140B of the capacitor 140 is substantially perpendicular to the bottom surface of the dielectric layer (such as the first nitride layer 102). Therefore, the bottom portion 140B of the capacitor 140 is wide enough to provide a strong support of the capacitor 140 and make the structure of the capacitor 140 stable. In some embodiments, the high-k dielectric layer 144 and the top electrode layer 146 may be formed between the first nitride layer 102 and the second nitride layer 106, and between the second nitride layer 106 and the third nitride layer 110. The high-k dielectric layer 144 is wrapped around the dielectric layers (such as first nitride layer 102, the second nitride layer 106, the third nitride layer 110) and the bottom electrode layer 142. The top electrode layer 146 is wrapped around the high-k dielectric layer 144. Therefore, the high-k dielectric layer 144 and the top electrode layer 146 may be planar and inclined layers. In some embodiments, the high-k dielectric layer 144 may be a continuous layer on the third nitride layer 110 and extending from one of the bottom electrode layer 142 to another bottom electrode layer 142. The high-k dielectric layer 144 may be in contact with bottom surfaces and top surfaces of the dielectric layers (such as bottom surface 106B and top surface 106T).

The semiconductor structure further includes a plurality of the semiconductor layers 150 vertically between the dielectric layers (i.e. the first nitride layer 102, the second nitride layer 106 and the third nitride layer 110). The semiconductor layers 150 are also formed over the top electrode layer 146 and in the opening 120. It is noted that the capacitors 140 in FIG. 14 are illustrative, and the capacitors 140 are not limited to the configuration illustrated in FIG. 14. For example, additional layers may be included in the capacitors 140.

As mentioned above, the capacitor in some embodiments of the present disclosure has a bottom portion and an upper portion. The sidewall of the upper portion is more inclined than the sidewall of the bottom portion of the capacitor. As such, the bottom portion of the capacitor is wide enough to provide a strong support of the capacitor and make the structure of the capacitor stable.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a semiconductor structure, comprising:
   forming a dielectric layer stack, wherein the dielectric layer stack comprises a first oxide layer and a second oxide layer over the first oxide layer;
   forming an opening in the dielectric layer stack, wherein the opening comprises a first portion exposing sidewalls of the first oxide layer and a second portion exposing sidewalls of the second oxide layer;
   forming a sacrificial layer over a top surface of the dielectric layer stack and along the sidewalls of the first oxide layer and sidewalls of the second oxide layer in the opening;
   performing a first etching process to remove a first portion of the sacrificial layer along the sidewalls of the first oxide layer;
   performing a second etching process to widen the first portion of the opening;
   removing a second portion of the sacrificial layer along the sidewalls of the second oxide layer and over the top surface of the dielectric layer stack; and
   forming a capacitor in the opening of the dielectric layer stack after removing the second portion of the sacrificial layer.

2. The manufacturing method of claim 1, wherein forming a dielectric layer stack comprises sequentially forming a first nitride layer, the first oxide layer, a second nitride layer, the second oxide layer and a third nitride layer from bottom to top.

3. The manufacturing method of claim 1, wherein the first oxide layer is doped with a dopant, and the dopant comprises boron, phosphorus, or combinations thereof.

4. The manufacturing method of claim 3, further comprising adjusting a concentration of the dopant during forming the dielectric layer stack, such that the concentration of the dopant in the first oxide layer becomes lower as being farther away from a bottom surface of the dielectric layer stack.

5. The manufacturing method of claim 1, wherein the sacrificial layer along the sidewalls of the second oxide layer is thicker than the sacrificial layer along the sidewalls of the first oxide layer during forming the sacrificial layer.

6. The manufacturing method of claim 1, wherein the first etching process further laterally and partially removes the sacrificial layer along the sidewalls of the second oxide layer.

7. The manufacturing method of claim 1, further comprising controlling duration of the first etching process to remove the sacrificial layer along the sidewalls of the first oxide layer.

8. The manufacturing method of claim 1, wherein a first etchant used in the first etching process etches the sacrificial layer faster than etches the first oxide layer.

9. The manufacturing method of claim 1, wherein a second etchant used in the second etching process etches the first oxide layer faster than etches the sacrificial layer.

10. A manufacturing method of a semiconductor structure, comprising:
    forming a dielectric layer stack, wherein the dielectric layer stack comprises a first nitride layer, a first oxide layer, a second nitride layer, a second oxide layer and a third nitride layer from bottom to top;
    forming an opening in the dielectric layer stack, wherein the opening comprises a first portion exposing sidewalls of the first oxide layer and a second portion exposing sidewalls of the second oxide layer, and a width of the second portion of the opening has a width being greater than a width of the first portion of the opening;
    widening the first portion of the opening, such that the sidewalls of the first oxide layer is substantially perpendicular to a bottom surface of the dielectric layer stack; and
    forming a capacitor in the opening of the dielectric layer stack after widening the first portion of the opening.

11. The manufacturing method of claim 10, wherein forming the capacitor in the opening of the dielectric layer stack comprises:
    forming a bottom electrode layer along sidewalls of the opening;
    removing a portion of the third nitride layer and a bottom electrode layer to form a first hole exposing a corner of the second oxide layer;
    removing the second oxide layer from the first hole;
    forming a second hole in the second nitride layer to expose a portion of the first oxide layer;
    removing the first oxide layer from the second hole;
    forming a high-k dielectric layer along a sidewall of the bottom electrode layer; and
    forming a top electrode layer along a sidewall of the high-k dielectric layer.

12. The manufacturing method of claim 11, further comprising forming semiconductor layers between the first nitride layer and the second nitride layer, and between the second nitride layer and the third nitride layer.

13. The manufacturing method of claim 11, further comprising forming a semiconductor layer in contact with the top electrode layer.

14. The manufacturing method of claim 11, wherein a slope of a sidewall of the bottom electrode layer between the first nitride layer and the second nitride layer is different from a slope of a sidewall of the bottom electrode layer between the second nitride layer and the third nitride layer.

15. The manufacturing method of claim 11, wherein the high-k dielectric layer is between the first nitride layer and the second nitride layer.

* * * * *